United States Patent
Chiba et al.

(10) Patent No.: US 7,638,267 B2
(45) Date of Patent: Dec. 29, 2009

(54) PATTERN FORMING METHOD AND MANUFACTURING METHOD OF SEMICONDUCTOR DEVICE

(75) Inventors: Kenji Chiba, Tokyo (JP); Hirokazu Kato, Zushi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 645 days.

(21) Appl. No.: 11/515,933

(22) Filed: Sep. 6, 2006

(65) Prior Publication Data
US 2007/0105054 A1    May 10, 2007

(30) Foreign Application Priority Data
Sep. 6, 2005    (JP)    ............... 2005-258128

(51) Int. Cl.
*G03F 7/00* (2006.01)
(52) U.S. Cl. ............... 430/330; 430/273.1; 430/312; 430/313; 430/320; 430/322; 430/325
(58) Field of Classification Search ............... 430/312, 430/313, 320, 322, 325, 330
See application file for complete search history.

(56) References Cited

U.S. PATENT DOCUMENTS 6,551,938 B1 *    4/2003    Wu et al. ............... 438/700

| | | |
|---|---|---|
| 2004/0137377 A1 | 7/2004 | Shinbori et al. |
| 2005/0214695 A1 | 9/2005 | Kato et al. |

FOREIGN PATENT DOCUMENTS

| | | |
|---|---|---|
| JP | 3-268427 | 11/1991 |
| JP | 2003-45777 | 2/2003 |
| JP | 2003-303757 | 10/2003 |
| JP | 2005-277052 | 10/2005 |

* cited by examiner

*Primary Examiner*—Thorl Chea
(74) *Attorney, Agent, or Firm*—Finnegan, Henderson, Farabow, Garrett & Dunner, L.L.P.

(57) ABSTRACT

According to an aspect of the invention, there is provided a pattern forming method including forming a lower layer organic film on a substrate, forming an upper layer resist film containing an inorganic element on the lower layer organic film, exposing a pattern on the upper layer resist film and performing development processing to form an opening in the upper layer resist film, supplying a coating forming agent to the upper layer resist film having the opening formed therein to embed and form a coating film in the opening of the upper layer resist film, thermally contracting the coating film to narrow the opening of the upper layer resist film, removing the coating film by dry etching processing and subsequently selectively removing the lower layer organic film with the upper layer resist film being used as a mask, thereby collectively processing the coating film and the lower layer organic film.

16 Claims, 3 Drawing Sheets

PATTERN FORMING METHOD AND MANUFACTURING METHOD OF SEMICONDUCTOR DEVICE

CROSS-REFERENCE TO RELATED APPLICATIONS

This application is based upon and claims the benefit of priority from prior Japanese patent application No. 2005-258128, filed Sep. 6, 2005, the entire contents of which are incorporated herein by reference.

BACKGROUND OF THE INVENTION

1. Field of the Invention

The present invention relates to a pattern forming method and a manufacturing method of a semiconductor device which are used for processing of a substrate such as a semiconductor substrate, a glass substrate or a resin substrate, and more particularly to a pattern forming method and a manufacturing method of a semiconductor device which utilize a two-layer resist process.

2. Description of the Background Art

In recent years, with high integration of semiconductor devices, a wiring line and a separation width required in a manufacturing process are further miniaturized. Generally, this type of miniaturized pattern is formed by forming a resist pattern by a photolithography technology and etching an underlying film with the formed resist pattern being used as a mask. Therefore, the photolithography technology is important in formation of a fine pattern. However, there arises a limit in miniaturization of the photolithography technology since miniaturization is restricted by an exposure wavelength.

Thus, e.g., Jpn. Pat. Appln. KOKAI Publication No. 2003-303757 proposes a method of using a water-soluble resin coating forming agent to narrow a hole diameter of a hole resist pattern formed by photolithography processing. In this method, resist patterns are formed on a substrate by photolithography processing, and then the resist patterns are coated with the water-soluble resin coating forming agent. Subsequently, a heat treatment is performed to thermally contract the coating forming agent, and this thermal contraction function is utilized to narrow a gap between the resist patterns. Then, after the coating forming agent is removed by a pure water rinse, the substrate is selectively etched with the resist pattern having the narrowed hole diameter being used as a mask.

According to this method, the hole diameter can be reduced to be smaller than a dimension restricted in photolithography. However, a process of removing the coating forming agent is newly required, and the number of processes is increased as compared with a conventional resist pattern forming method. Further, after removal of the coating forming agent, residual dross is apt to be generated, and this residual dross may possibly adversely affect subsequent formation of the pattern.

As a method of reducing an opening dimension of a resist pattern, the method of utilizing thermal contraction of a coating forming agent has been conventionally proposed in this manner, but this method may result in a problem of an increase in the number of processes such as rinse processing of the coating forming agent.

BRIEF SUMMARY OF THE INVENTION

According to an aspect of the invention, there is provided a pattern forming method comprising: forming a lower layer organic film on a processing target substrate; forming an upper layer resist film containing an inorganic element on the lower layer organic film; exposing a desired pattern on the upper layer resist film and then performing development processing to form an opening in the upper layer resist film; supplying a coating forming agent to the upper layer resist film having the opening formed therein to embed and form a coating film in the opening of the upper layer resist film; thermally contracting the coating film to narrow the opening of the upper layer resist film; removing the coating film by dry etching processing and subsequently selectively removing the lower layer organic film with the upper layer resist film being used as a mask, thereby collectively processing the coating film and the lower layer organic film.

According to another aspect of the invention, there is provided a manufacturing method of a semiconductor device which manufactures the semiconductor device, comprising: forming a lower layer organic film on a processing target substrate; forming an upper layer resist film containing an inorganic element on the lower layer organic film; exposing a desired pattern to the upper layer resist film and then performing development processing to form an opening in the upper layer resist film; supplying a coating forming agent to the upper layer resist film having the opening formed therein to embed and form a coating film in the opening of the upper layer resist film; thermally contracting the coating film to narrow the opening of the upper layer resist film; and removing the coating film by dry etching processing and subsequently selectively removing the lower layer organic film with the upper layer resist film being used as a mask, thereby collectively processing the coating film and the lower layer organic film.

DETAILED DESCRIPTION OF THE INVENTION

Embodiments according to the present invention will now be described hereinafter with reference to the accompanying drawings.

FIGS. 1A, 1B, 1C, 1D, 2A and 2B are cross-sectional views showing pattern forming processes according to a first embodiment of the present invention. This embodiment is a resist pattern forming method using a two-layer resist process.

Figure 1A:
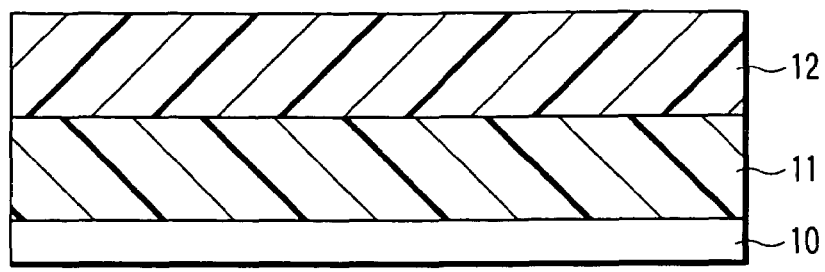
FIGS. 1A, 1B, 1C and 1D are cross-sectional views showing resist pattern forming processes according to a first embodiment.

First, as shown in FIG. 1A, a lower layer organic film 11 and an upper layer resist film 12 containing an inorganic element are sequentially formed on a processing target substrate (a silicon substrate) 10 by using a spin coat method. Here, as materials, coating type carbon is used for the lower layer organic film 11, and a chemical amplification type positive resist for ArF light (a wavelength: 193 nm) is used for the upper layer resist film 12. As the inorganic element contained in the upper layer resist film 12, silicon (Si) is used. The pattern forming method of the chemical amplification type resist in the two-layer resist process will now be specifically described hereinafter.

Figure 1B:
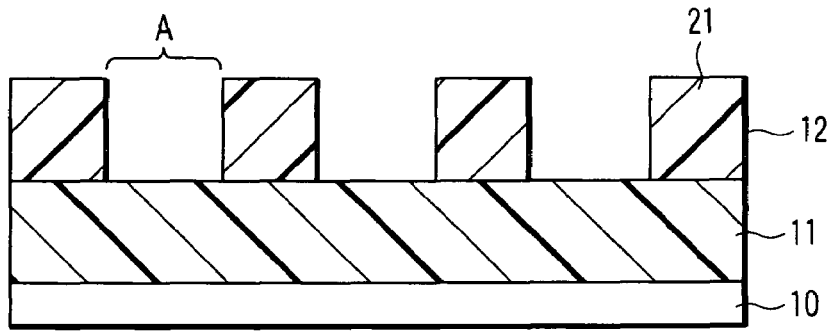

Then, an ArF excimer laser is used to preform reduced projection exposure of a hole pattern with respect to the resist film 12 through an exposure reticle. The processing target substrate 10 is heated under conditions of 130° C. and 60 seconds, and carried to a development apparatus. The development apparatus supplies a developing fluid onto the processing target substrate 10, performs development for 30 seconds, then supplies pure water while rotating the processing target substrate 10, stops a reaction, effects cleaning, and dries the processing target substrate 10 by spin drying. Effecting these processes forms a first resist pattern 21 having a hole diameter A=150 nm as shown in FIG. 1B.

Figure 1C:
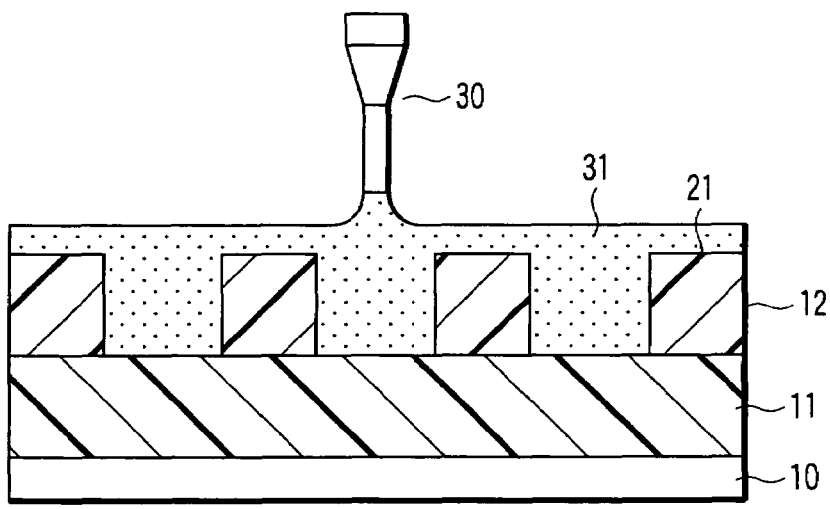

Then, as shown in FIG. 1C, a water-soluble resin coating forming agent 31 consisting of a material disclosed in, e.g., Jpn. Pat. Appln. KOKAI Publication No. 2003-303757 is supplied from a nozzle 30 to a surface of the processing target substrate 10 having the first resist pattern 21 formed thereon.

Figure 1D:
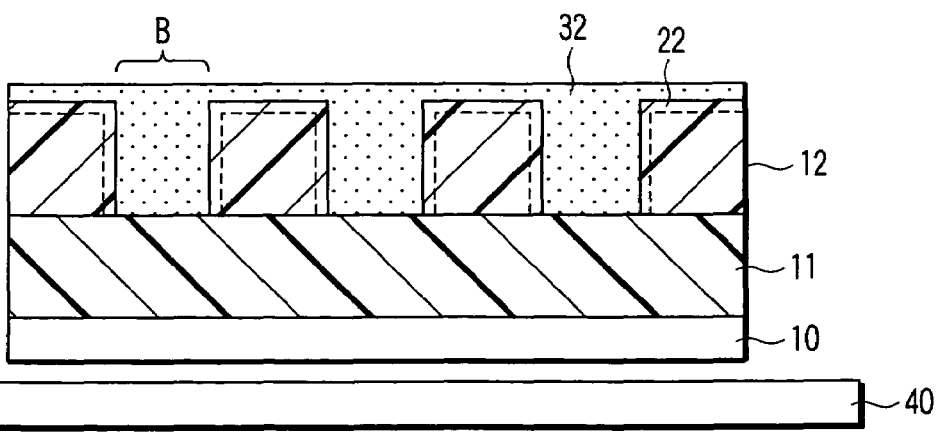

Subsequently, as shown in FIG. 1D, the coating forming agent 31 is thermally contracted by effecting a heat treatment under conditions of 145° C. and 60 seconds. At this time, the resist film 12 is pulled toward the inside of each hole by a thermal contraction function of the coating forming agent 31 in each hole of the resist film 12. Therefore, a tension layer is formed on the resist layer 12, whereby a hole diameter of the resist film 12 is reduced. The hole diameter B of the thus obtained second resist pattern 22 is approximately 140 nm.

Figure 2A:
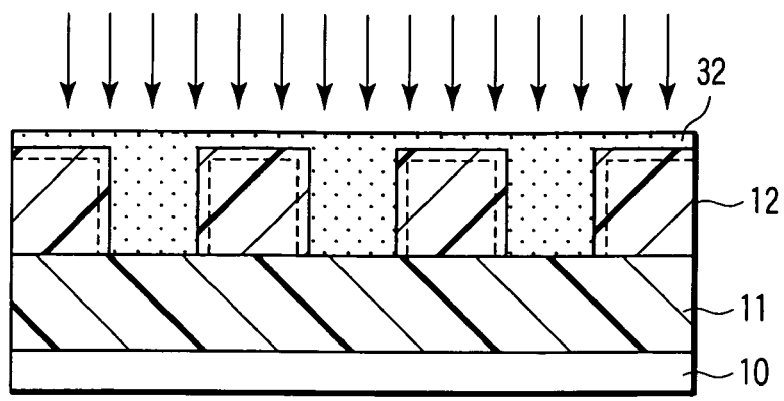
FIGS. 2A and 2B are cross-sectional views showing resist pattern forming processes according to the first embodiment.
Figure 2B:
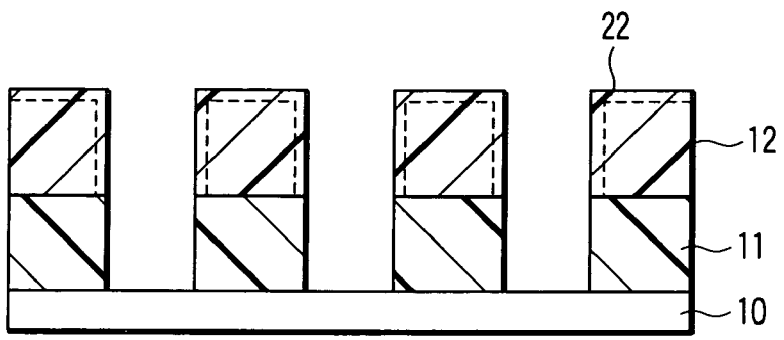

Then, as shown in FIG. 2A, anisotropic etching processing is carried out by RIE which is dry etching processing using oxygen plasma. As a result, as shown in FIG. 2B, the coating film 32 is removed and the lower layer organic film 11 is collectively processed with the second resist pattern 22 being used as a mask pattern, whereby the organic film 11 is selectively removed and the second resist pattern 22 is pattern-transferred onto the organic film 11.

With the above-described processes, a hole diameter of the pattern transferred onto the lower layer organic film 11 becomes approximately 140 nm. That is, a hole shrinkage amount of the resist pattern is approximately 10 nm. Then, predetermined manufacturing processes of a semiconductor device are carried out to finally produce the semiconductor device.

Figure 4A:
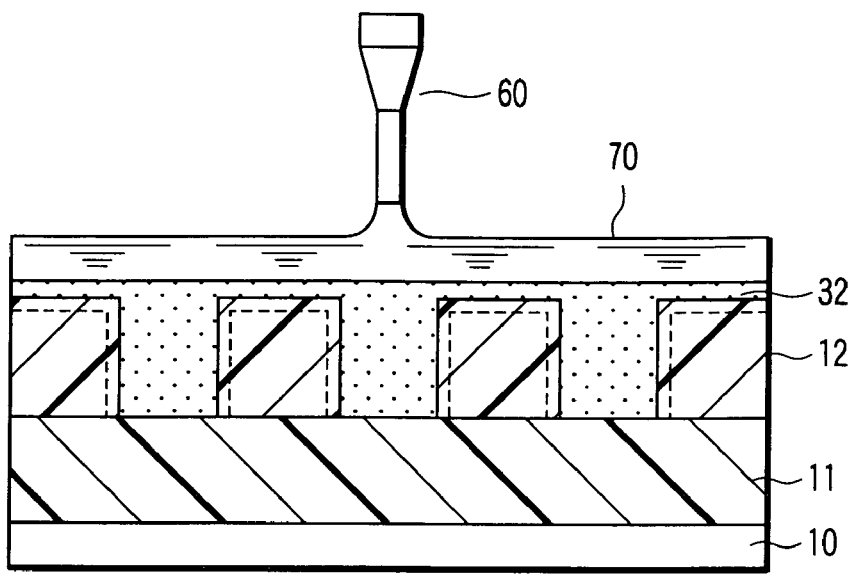
FIGS. 4A, 4B and 4C are cross-sectional views showing resist pattern forming processes according to a conventional method.
Figure 4B:
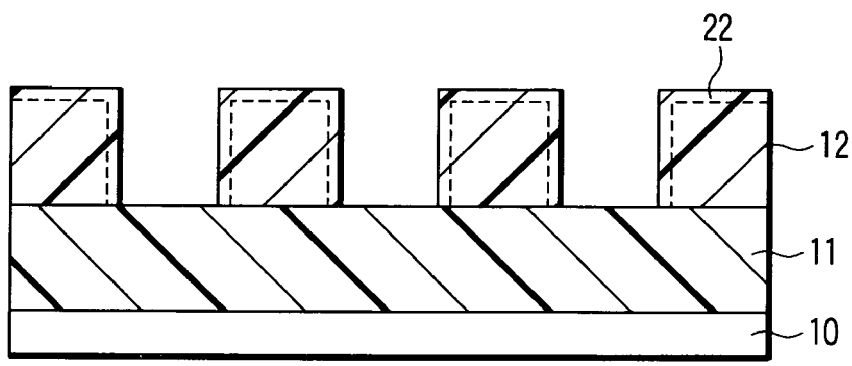
Figure 4C:
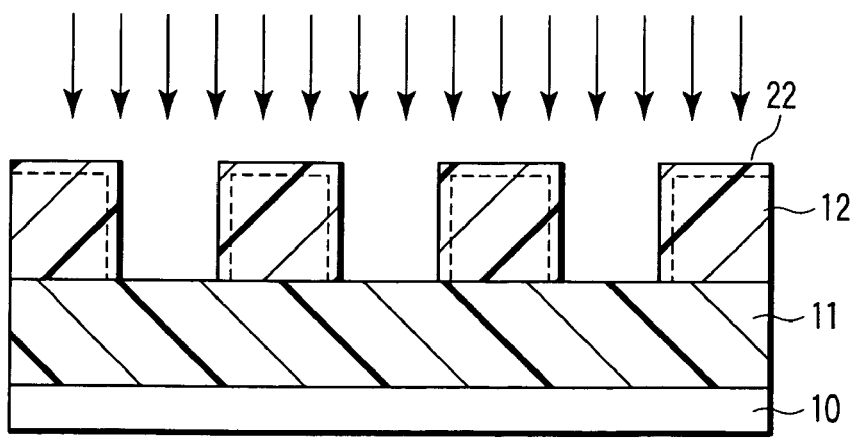

It is to be noted that, in a conventional method, after the process shown in FIG. 1D, as shown in FIG. 4A, rinse processing is performed by supplying pure water 70 from a nozzle 60. As a result, as shown in FIG. 4B, the coating film 32 is removed with a water-soluble resin coating forming agent. Subsequently, drying processing is performed to remove the pure water. Subsequently, as shown in FIG. 4C, anisotropic etching processing using oxygen plasma is performed to process the lower layer organic film 11 with the second resist pattern 22 being used as a mask, thereby pattern-transferring the second resist pattern 22 to the organic film 11. Thereafter, processes like the first embodiment are performed.

As described above, according to this embodiment, thermal contraction of the water-soluble coating forming agent 31 can be utilized to further reduce an opening dimension of the resist pattern. Further, in this case, the coating film 32 is not removed by rinsing, but the coating film 32 and the lower layer organic film 11 are simultaneously etched by RIE, and hence a removal process of the coating film 32 based on the rinsing/drying processing is no longer necessary. Therefore, the opening dimension of the resist pattern can be further reduced without increasing the number of processes such as rinsing processing of the coating forming agent, and hence this method is very useful for subsequent miniaturization processes.

Figure 3A:
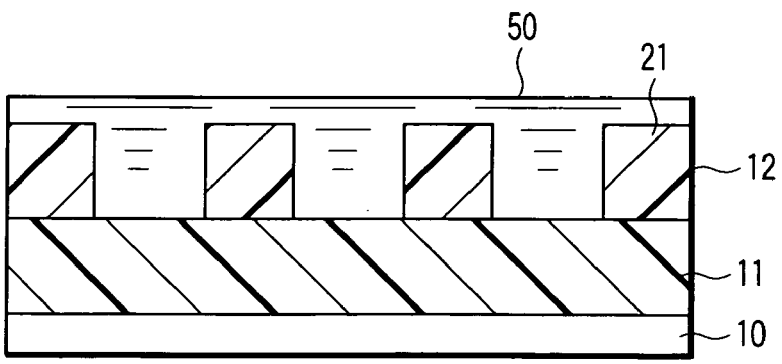
FIGS. 3A and 3B are cross-sectional views showing resist pattern forming processes according to a second embodiment.
Figure 3B:
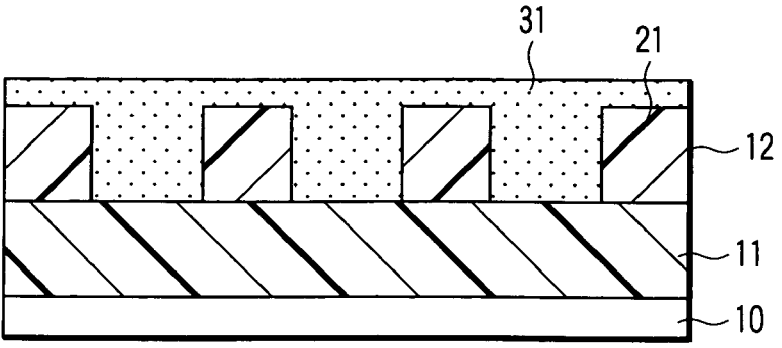

FIGS. 3A and 3B are cross-sectional views showing pattern forming processes according to a second embodiment. It is to be noted that, in FIGS. 3A and 3B, like reference numerals denote parts equal to those in FIGS. 1A, 1B, 1C and 1D, thereby eliminating the detailed explanation thereof.

This embodiment is a resist pattern forming method using a two-layer resist process, and utilizes a technology disclosed in Jpn. Pat. Appln. KOKAI Publication No. 2005-277052.

First, as shown in FIG. 1A like the first embodiment, a lower layer organic film 11 and a chemical amplification type resist film 12 containing an inorganic element are sequentially formed on a processing target substrate 10 by using a spin coat method.

Then, an ArF excimer laser is used to perform reduced projection exposure of a pattern through an exposure reticle. The substrate is subjected to a heat treatment under conditions of 130° C. for 60 seconds, and carried to a development apparatus. The development apparatus supplies a developing fluid onto the processing target substrate, performs development for 30 seconds, then supplies pure water while rotating the processing target substrate 10, stops a reaction and effects cleaning.

FIG. 3A shows a state in which pure water is supplied as a rinse agent 50 onto a surface of the processing target substrate 10 after development. From this state, as shown in FIG. 3B, a water-soluble resin coating forming agent 31 substitutes for at least a part of the rinse agent 50.

Then, like the first embodiment, as shown in FIG. 1D, the coating forming agent 31 is thermally contracted by effecting a heat treatment under conditions of 145° C. and 60 seconds to form a coating film 32, and a gap between the resist patterns is narrowed to form a second resist pattern 22.

Thereafter, like the first embodiment, as shown in FIGS. 2A and 2B, anisotropic etching processing using oxygen plasma is performed to remove the coating film 32 and collectively process the lower layer organic film 11 with the second resist pattern 22 being used as a mask, whereby the organic film 11 is selectively removed and the second resist pattern 22 is pattern-transferred to the organic film 11.

With the above-described processes, a hole diameter of the pattern transferred onto the lower layer organic film 11 becomes approximately 140 nm. Even such a method can obtain the same effect as that of the first embodiment. Then, predetermined manufacturing processes of a semiconductor device are performed to finally produce the semiconductor device.

It is to be noted that the present invention is not restricted to the foregoing embodiments. Although the coating type carbon film is used as the lower layer organic film in the embodiments, the lower layer organic film is not restricted to the coating type carbon film. Basically, any film can be used as the lower layer organic film as long as the lower layer organic film can be selectively removed with the second resist pattern being used as a mask in the oxygen plasma etching processing and the second resist pattern can be transferred. For example, a Novolac resin film, a sputter-carbon film, a CVD-carbon film and an organic film which does not contain an inorganic element are effective, these films having high selectivity in etching processing with respect to a resist containing an inorganic element. The etching condition is that the resist containing an inorganic element has low etching rate and the lower layer organic film has high etching rate. That is, the etching resistance of the resist containing an inorganic element is higher than that of the lower layer organic film.

Moreover, in this embodiments, the water-soluble resin coating forming agent is supplied to the surface of the processing target substrate having the first resist patterns formed thereon, then the coating forming agent is thermally contracted by the heat treatment under conditions of 145° C. and 60 seconds, and this thermal contraction function is utilized to reduce the gap between the first resist patterns. Additionally, the hole diameter of each formed second resist pattern is 140 nm, and the hole shrinkage amount of the same is approximately 10 nm. However, the heating treatment conditions are not restricted thereto. Since the reactivity with respect to the thermal contraction function varies depending on each type of resist, and hence it is good enough to appropriately select optimum conditions in accordance with a necessary hole shrinkage amount. Further, the coating forming agent is not necessarily restrict to the water-soluble resin, and any material can be used. The material is necessary to be filled in the opening of the resist film to form the coating film and to pull the resist film toward the inside of the opening by utilizing the thermal contraction function, without mixing with the resist film and deforming the patterns.

Furthermore, the above has described the example where the resist film containing the inorganic element for ArF is used as the upper layer resist film and the ArF exposure apparatus is utilized as the exposure apparatus in the foregoing embodiments, but the embodiments of the present invention are not restricted thereto. It is possible to use a resist film containing an inorganic element which has the sensitivity with respect to a g ray, an i ray, KrF, $F_2$, EUV, an electron beam and others and an exposure apparatus corresponding to such a film. Moreover, the inorganic element contained in the resist film is not restricted to silicon (Si), and it is possible to use germanium (Ge) and tin (Sn) as well as various kinds of materials containing an inorganic element.

Additionally, the method of etching the coating film and the lower layer organic film is not necessarily restricted to the oxygen plasma processing, and it is good enough to carry out a dry etching method capable of etching the coating film and the lower layer organic film with a sufficient selection ratio with respect to the upper layer resist film.

According to this embodiment, it is possible to provide the pattern forming method which can reduce the opening dimension of the resist pattern without increasing the number of processes such as rinsing processing with respect to the coating film agent, and can be effectively utilized for subsequent miniaturization processes. That is, as compared with a conventional pattern forming method, a process of removing the coating film based on rinsing/drying processing is no longer necessary, and processes from removal of the coating film to pattern transfer onto the lower layer film can be carried out at the same step by the oxygen plasma processing, thereby simplifying the processes.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern forming method comprising:
    forming a lower layer organic film on a processing target substrate;
    forming an upper layer resist film containing an inorganic element on the lower layer organic film;
    exposing a desired pattern on the upper layer resist film and then performing development processing to form an opening in the upper layer resist film;
    supplying a coating forming agent to the upper layer resist film having the opening formed therein to embed and form a coating film in the opening of the upper layer resist film;
    thermally contracting the coating film to narrow the opening of the upper layer resist film;
    removing the coating film by dry etching processing and subsequently selectively removing the lower layer organic film with the upper layer resist film being used as a mask, thereby collectively processing the coating film and the lower layer organic film.

2. The pattern forming method according to claim 1, wherein the inorganic element contained in the upper layer resist film is silicon (Si).

3. The pattern forming method according to claim 1, wherein the upper layer resist film has dry etching resisting properties higher than those of the lower layer organic film and the coating film.

4. The pattern forming method according to claim 1, wherein the coating forming agent is a water-soluble resin.

5. The pattern forming method according to claim 1, wherein, as a method of supplying the coating forming agent, pure water is supplied to the upper layer resist film subject to the development processing to effect cleaning processing, and subsequently pure water substitutes for the coating forming agent.

6. The pattern forming method according to claim 1, wherein the lower layer organic film is a coating type carbon film.

7. The pattern forming method according to claim 1, wherein the etching resistance of the resist containing the inorganic element is higher than that of the lower layer organic film.

8. The pattern forming method according to claim 1, wherein the upper layer resist film is configured for ArF.

9. A manufacturing method of a semiconductor device which manufactures the semiconductor device, comprising:
    forming a lower layer organic film on a processing target substrate;
    forming an upper layer resist film containing an inorganic element on the lower layer organic film;
    exposing a desired pattern to the upper layer resist film and then performing development processing to form an opening in the upper layer resist film;
    supplying a coating forming agent to the upper layer resist film having the opening formed therein to embed and form a coating film in the opening of the upper layer resist film;
    thermally contracting the coating film to narrow the opening of the upper layer resist film; and
    removing the coating film by dry etching processing and subsequently selectively removing the lower layer organic film with the upper layer resist film being used as a mask, thereby collectively processing the coating film and the lower layer organic film.

10. The manufacturing method of a semiconductor device according to claim 9, wherein the inorganic element contained in the upper layer resist film is silicon (Si).

11. The manufacturing method of a semiconductor device according to claim 9, wherein the upper layer resist film has dry etching resisting properties higher than those of the lower layer organic film and the coating film.

12. The manufacturing method of a semiconductor device method according to claim 9, wherein the coating forming agent is a water-soluble resin.

13. The manufacturing method of a semiconductor device according to claim 9, wherein, as a method of supplying the coating forming agent, pure water is supplied to the upper layer resist film subject to the development processing to effect cleaning processing, and subsequently pure water substitutes for the coating forming agent.

14. The manufacturing method of a semiconductor device according to claim 9, wherein the lower layer organic film is a coating type carbon film.

15. The manufacturing method of a semiconductor device according to claim 9, wherein the etching resistance of the resist containing the inorganic element is higher than that of the lower layer organic film.

16. The manufacturing method of a semiconductor device according to claim 9, wherein the upper layer resist film is configured for ArF.

* * * * *